United States Patent [19]
Shimozono et al.

[11] Patent Number: 5,497,114
[45] Date of Patent: Mar. 5, 1996

[54] FLIP-FLOP CIRCUIT

[75] Inventors: Motoki Shimozono; Shinya Udo; Fumitaka Asami, all of Kawasaki, Japan

[73] Assignees: Fujitsu Limited, Kanagawa; Kyushu Fujitsu Electronics Limited, Kagoshima, both of Japan

[21] Appl. No.: 299,117

[22] Filed: Sep. 2, 1994

[30] Foreign Application Priority Data

Dec. 22, 1993 [JP] Japan .................................. 5-323953

[51] Int. Cl.$^6$ .............................. H03K 17/22; H03K 5/13
[52] U.S. Cl. ......................... 327/202; 327/203; 327/208; 327/210; 327/211; 327/212
[58] Field of Search .................................. 327/199, 202, 327/203, 197, 200, 201, 208, 210, 211, 218; 377/78, 79, 104, 105

[56] References Cited

U.S. PATENT DOCUMENTS

| | | | |
|---|---|---|---|
| 4,250,406 | 2/1981 | Alaspa | 377/79 |
| 4,390,987 | 6/1983 | Best | 370/112 |
| 4,506,167 | 3/1985 | Little et al. | 327/211 |
| 4,703,200 | 10/1987 | Zangara | 327/211 |
| 4,705,965 | 11/1987 | Stuyt | 377/105 |
| 5,081,377 | 1/1992 | Freyman | 327/211 |
| 5,159,616 | 10/1992 | Douglas et al. | 377/105 |
| 5,175,753 | 12/1992 | Gaglani | 377/105 |
| 5,212,411 | 5/1993 | Asazawa | 307/279 |
| 5,239,206 | 8/1993 | Yanai | 377/79 |
| 5,264,738 | 11/1993 | Veendrick et al. | 327/203 |

*Primary Examiner*—Timothy P. Callahan
*Assistant Examiner*—Eunja Shin
*Attorney, Agent, or Firm*—Nikaido Marmelstein Murray & Oram

[57] ABSTRACT

A flip-flop circuit includes a first switch for controlling passing of input data in response to a single clock signal, a first inverter for inverting the data passed through the first switch, a second inverter for inverting the data output from the first inverter into inverted data and for inputting the inverted data to the first inverter, a second switch for controlling passing of the data output from the first inverter in response to the single clock signal, a third inverter for inverting the data passed through the second switch, and a fourth inverter for inverting the data output from the third inverter into inverted data and for inputting the inverted data to the third inverter, where the first inverter has a driving capability larger than that of the second inverter, and the third inverter has a driving capability larger than that of the fourth inverter.

3 Claims, 9 Drawing Sheets

5,497,114

1
FLIP-FLOP CIRCUIT

BACKGROUND OF THE INVENTION

The present invention generally relates to flip-flop circuits, and more particularly to a flip-flop circuit such as a master slave type flip-flop circuit having a reduced number of transistor gates.

Flip-flop circuits are one of basic circuits most frequently used in digital circuits. Hence, in order to further improve the integration density of integrated circuits, it is necessary to further reduce the number of transistor gates of the flip-flop circuit.

A master slave type flip-flop circuit is made up of a master circuit and a slave circuit. The master circuit latches the input data during a first half of 1 clock period, and the slave circuit latches and outputs during the second half of the 1 clock period the input data that was latched by the master circuit.

FIG. 1 shows the circuit construction of an example of a conventional master slave type flip-flop circuit. In FIG. 1, a master circuit includes transmission gates 1 and 2, and CMOS inverters 5 and 6. On the other hand, a slave circuit includes transmission gates 3 and 4, and CMOS inverters 7, 8 and 9. Each of the transmission gates 1 through 4 are made up of a PMOS gate and a NMOS gate which are connected in parallel. A clock signal CK and an inverted clock signal/CK are applied to each of the transmission gates 1 through 4.

In FIG. 1, when the clock signal CK has a low level, the transmission gate 1 turns ON and the input data is input to the CMOS inverter 5. In this state, the transmission gates 2 and 3 are OFF, and the transmission gate 4 is ON.

Next, when the clock signal CK undergoes a transition to a high level, the transmission gate 2 turns ON. As a result, the CMOS inverter 6 inverts the data output from the CMOS inverter 5 and inputs the inverted data to the CMOS inverter 5, so that the CMOS inverter 5 latches the input data. On the other hand, the transmission gate 3 turns ON, and the input data latched by the CMOS inverter 5 is input to the CMOS inverter 7. In this state, the transmission gates 1 and 4 are OFF.

Then, when the clock signal CK undergoes a transition to the low level, the transmission gate 4 turns ON. As a result, the CMOS inverter 8 inverts the data output from the CMOS inverter 7 and inputs the inverted data to the CMOS inverter 7, so that the CMOS inverter 7 latches the input data. Responsive to this latch process, the CMOS inverter 7 outputs the input data to the outside, and the CMOS inverter 9 outputs an inverted value of the input data to the outside.

Therefore, according to the conventional master slave type flip-flop circuit, the master circuit latches the input data during the first half of 1 clock period, and the slave circuit latches and outputs during the second half of the 1 clock period the input data that was latched in the master circuit.

On the other hand, a toggle type flip-flop circuit has the function of inverting the output for every incoming clock signal, and is used in a counter circuit or the like. When forming the toggle type flip-flop circuit shown in FIG. 2 in the form of an integrated circuit using the conventional master slave type flip-flop circuit described above, the data output from the CMOS inverter 9 is input to a data terminal D to which the input data is supplied.

However, according to the conventional master slave type flip-flop circuit, a transmission gate is used at each of the four switching parts, and there was a problem in that the number of gates becomes large. In addition, there was another problem in that two kinds of clock signals (CK and/CK) are required to switch the transmission gates.

In other words, each transmission gate is made up of a parallel connection of the PMOS gate which turns ON when a low-level clock signal is input to the gate and turns OFF when a high-level clock signal is input to the gate, and the NMOS gate which turns ON when a high-level clock signal is input to the gate and turns OFF when a low-level clock signal is input to the gate. Hence, the ON state of the transmission gate is realized by turning ON both the PMOS gate and the NMOS gate, and the OFF state of the transmission gate is realized by turning OFF both the PMOS gate and the NMOS gate. For this reason, there were problems not only in that the number of gates becomes large, but also in that the two kinds of clock signals (CK and /CK) are required to switch the transmission gates.

SUMMARY OF THE INVENTION

Accordingly, it is a general object of the present invention to provide a novel and useful flip-flop circuit in which the problems described above are eliminated.

Another and more specific object of the present invention is to provide a flip-flop circuit comprising first switch means, made up of a first conductivity type transistor, for controlling passing of input data in response to a single clock signal, first inverter means for inverting the data passed through the first switch means, second inverter means for inverting the data output from the first inverter means into inverted data and for inputting the inverted data to the first inverter means, second switch means, made up of a second conductivity type transistor, for controlling passing of the data output from the first inverter means in response to the single clock signal, where the second conductivity type transistor is one of a P-channel and N-channel transistors and the first conductivity type transistor is the other of the P-channel and N-channel transistors, third inverter means for inverting the data passed through the second switch means, and fourth inverter means for inverting the data output from the third inverter means into inverted data and for inputting the inverted data to the third inverter means, where the first inverter means has a driving capability larger than that of the second inverter means, and the third inverter means has a driving capability larger than that of the fourth inverter means. According to the flip-flop-circuit of the present invention, it is possible to reduce the number of transistor gates compared to the conventional flip-flop circuit. In addition, it is possible to drive the flip-flop circuit using a single clock signal.

Still another object of the present invention is to provide a flip-flop circuit comprising first switch means, made up of a first conductivity type transistor, for controlling passing of input data in response to a single clock signal, first inverter means for inverting the data passed through the first switch means, second inverter means for inverting the data output from the first inverter means into inverted data and for inputting the inverted data to the first inverter means, second switch means, made up of a second conductivity type transistor, for controlling passing of the data output from the first inverter means in response to the single clock signal, where the second conductivity type transistor is one of a P-channel and N-channel transistors and the first conductivity type transistor is the other of the P-channel and N-channel transistors, third switching means, made up of a said second conductivity type transistor, for controlling passing of the data from the second inverter means to the first inverter means in response to the single clock signal, third inverter means for inverting the data passed through the second switch means, fourth inverter means for inverting the data output from the third inverter means into inverted data and for inputting the inverted data to the third inverter means, and fourth switch means, made up of a said first conductivity type transistor, for controlling passing of the data from the fourth inverter means to the third inverter means in response to the single clock signal. According to the flip-flop circuit of the present invention, it is possible to reduce the number of transistor gates compared to the conventional flip-flop circuit. In addition, it is possible to drive the flip-flop circuit using a single clock signal.

A further object of the present invention is to provide a flip-flop circuit comprising first switch means, made up of a first transmission gate having transistors, for controlling passing of input data in response to clock signals, first inverter means for inverting the data passed through the first switch means, second inverter means for inverting the data output from the first inverter means into inverted data and for inputting the inverted data to the first inverter means, second switch means, made up of a second transmission gate having transistors, for controlling the passing of the data output from the first inverter means in response to the clock signals, where the second transmission gate operates in a complementary manner to the first transmission gate, third switch means, made up of a said second transmission gate, for controlling passing of the data from the second inverter means to the first inverter means in response to the clock signals, third inverter means for inverting the data passed through the second switch means, fourth inverter means for inverting the data output from the third inverter means into inverted data and for inputting the inverted data to the third inverter means, fourth switch means, made up of a said first transmission gate, for controlling passing of the data from the fourth inverter means to the third inverter means in response to the clock signals, and means for inputting the data output from the fourth inverter means to the first switch means via the fourth switch means. According to the flip-flop circuit of the present invention, it is possible to reduce the number of transistor gates compared to the conventional flip-flop circuit.

Other objects and further features of the present invention will be apparent from the following detailed description when read in conjunction with the accompanying drawings.

DESCRIPTION OF THE PREFERRED EMBODIMENTS

Figure 1:
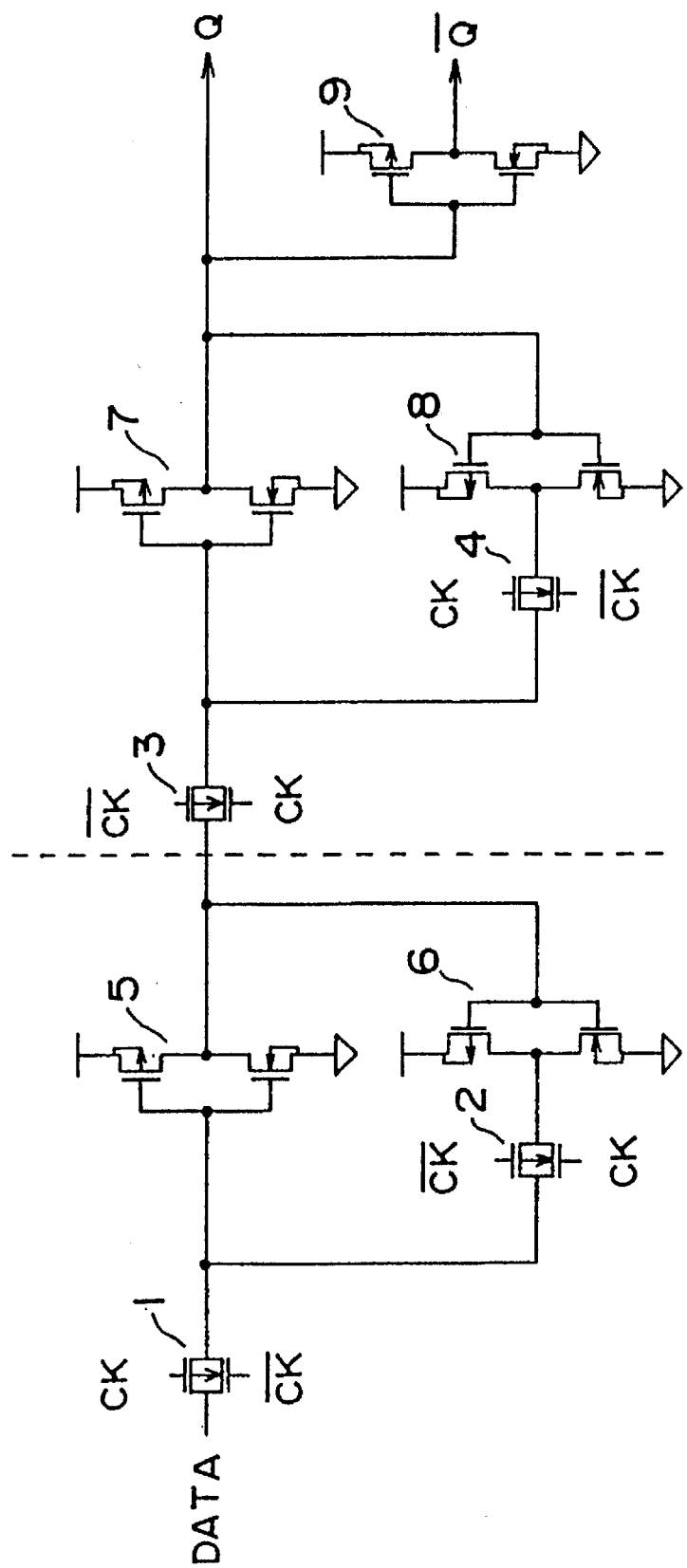
FIG. 1 is a circuit diagram showing an example of a conventional master slave type flip-flop circuit.
Figure 2:
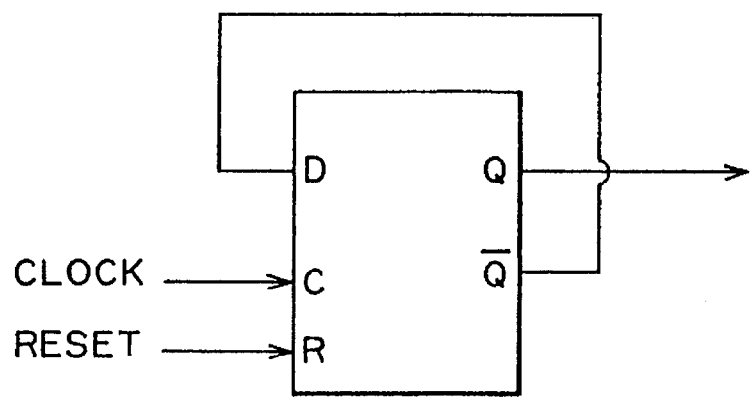
FIG. 2 is a block diagram showing a toggle type flip-flop circuit.

First, a description will be given of the operating principle of the present invention, by referring to FIGS. 3, 4 and 5.

A description will be given of one aspect of the present invention, by referring to FIG. 3. A flip-flop circuit shown in FIG. 3 includes a first switch means 10, a first inverter means 11, a second inverter means 12, a second switch means 13, a third inverter means 14, and a fourth inverter means 15 which are connected as shown.

The first switch means 10 is made up of a P-channel or N-channel transistor gate, and controls the passing of the input data depending on a clock signal CK. The first inverter means 11 inverts the data passed through the first switch means 10. The second inverter means 12 inverts the data output from the first inverter means 11 and inputs the inverted data to the first inverter means 11. The second switch means 13 is made up of a N-channel or P-channel transistor gate, that is, a transistor gate of a conductivity type opposite to that of transistor gate forming the first switch means 10. The second switch means 13 controls the passing of the data output from the first inverter means 11 depending on the clock signal CK. The third inverter means 14 inverts the data passed through the second switch means 13. The fourth inverter means 15 inverts the data output from the third inverter means 14, and inputs the inverted data to the third inverter means 14.

The driving capability of the first inverter means 11 is set larger than the driving capability of the second inverter means 12, so that the first inverter means 11 can receive the data passed through the first switch means 10 when the first switch means 10 is ON. In addition, the driving capability of the third inverter means 14 is set larger than the driving capability of the fourth inverter means 15, so that the third inverter means 14 can receive the data passed through the second switch means 13 when the second switch means 13 is ON.

Figure 3:
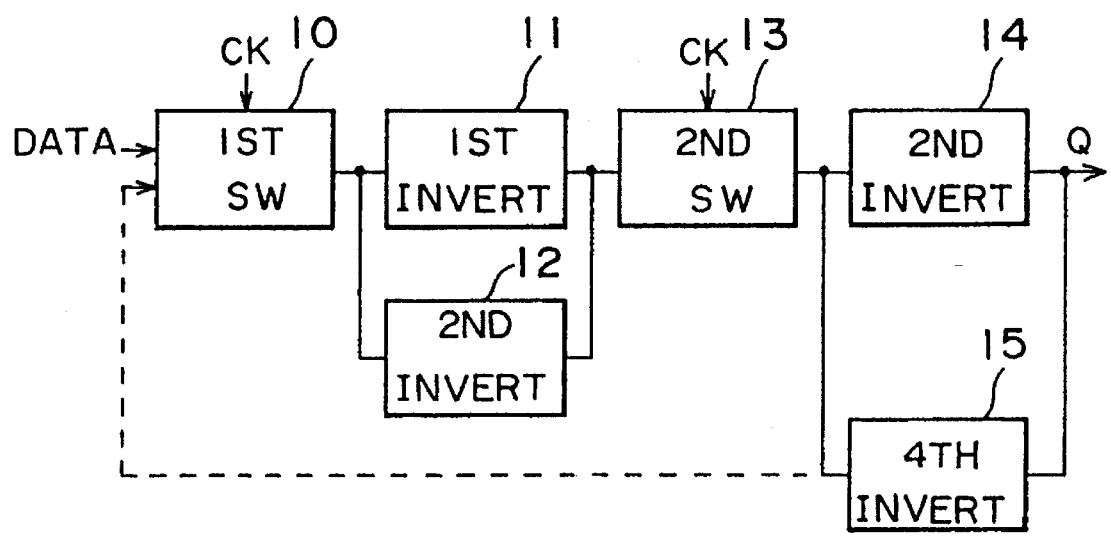
FIG. 3 is a system block diagram for explaining one aspect of the present invention.

When forming a toggle type flip-flop circuit using the flip-flop circuit shown in FIG. 3, a connection indicated by a dotted line in FIG. 3 is made so that the data output from the fourth inverter means 15 is input to the first switch means 10. In this case, the driving capability of the fourth inverter means 15 is set larger than the driving capability of the second inverter means 12, so that the first inverter means 11 can receive the data output from the fourth inverter means 15 when the first switch means 10 is ON.

Next, a description will be given of another aspect of the present invention, by referring to FIG. 4. In FIG. 4, those parts which are the same as those corresponding parts in FIG. 3 are designated by the same reference numerals, and a description thereof will be omitted.

Figure 4:
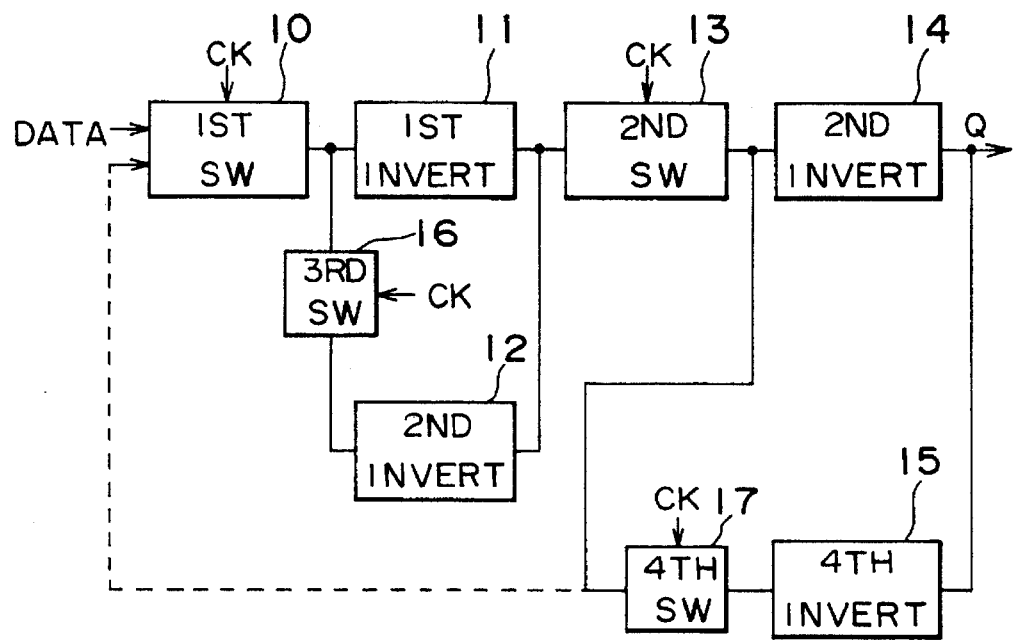
FIG. 4 is a system block diagram for explaining another aspect of the present invention.

A flip-flop circuit shown in FIG. 4 includes in addition to the means 10 through 15 shown in FIG. 3 a third switch means 16 and a fourth switch means 17. The third switch means 16 is made up of a transistor gate of a conductivity type opposite to that of the transistor gate forming the first switch means 10. This third switch means 16 controls the passing of the data from the second inverter means 12 to the first inverter means 11 depending on the clock signal CK. On the other hand, the fourth switch means 17 is made up of a transistor gate of the same conductivity type as the transistor gate forming the first switch means 10. This fourth switch means 17 controls the passing of the data from the fourth inverter means 15 to the third inverter means 14 depending on the clock signal CK.

By the provision of the third switch means 16, the first inverter means 11 can receive the data passed through the first switch means 10 without being affected by the driving capability of the second inverter means 12. As a result, no limiting conditions exist between the driving capability of the first inverter means 11 and the driving capability of the second inverter means 12. In addition, by the provision of the fourth switch means 17, the third inverter means 14 can receive the data passed through the second switch means 13 without being affected by the driving capability of the fourth inverter means 15. For this reason, no limiting conditions exist between the driving capability of the third inverter means 14 and the driving capability of the fourth inverter means 15.

When forming a toggle type flip-flop circuit using the flip-flop circuit shown in FIG. 4, a connection indicated by a dotted line in FIG. 4 is made so that the data output from the fourth inverter means 15 is input to the first switch means 10 via the fourth switch means 17. In this case, the first inverter means 11 can receive the data output from the fourth inverter means 15 without being affected by the driving capability of the second inverter means 12, and thus, no limiting conditions exist between the driving capability of the second inverter means 12 and the driving capability of the fourth inverter means 15.

Next, a description will be given of still another aspect of the present invention, by referring to FIG. 5. A flip-flop circuit shown in FIG. 5 includes a first switch means 20, a first inverter means 21, a second inverter means 22, a second switch means 23, a third inverter means 24, a fourth inverter means 25, a third switch means 26, and a fourth switch means 27 which are connected as shown.

The first switch means 20 is formed by a transmission gate which is made up of transistors, and controls passing of the input data depending on clock signals CK and /CK. The first inverter means 21 inverts the data passed through the first switch means 20. The second inverter means 22 inverts the data output from the first inverter means 21, and inputs the inverted data to the first inverter means 21. The third switch means 26 is formed by a transmission gate which is made up of transistors, and operates in a complementary manner to the first switch means 20 in response to the clock signals CK and /CK. This third switch means 26 controls the passing of the data from the second inverter means 22 to the first inverter means 21 depending on the clock signals CK and /CK.

The second switch means 23 is formed by a transmission gate which is made up of transistors, and operates in a complementary manner to the first switch means 20 in response to the clock signals CK and /CK. This second switch means 23 controls the passing of the data output from the first inverter means 20 depending on the clock signals CK and /CK. The third inverter means 24 inverts the data passed through the second switch means 23. The fourth inverter means 25 inverts the data output from the third inverter means 24, and inputs the inverted data to the third inverter means 24.

The fourth switch means 27 is formed by a transmission gate which is made up of transistors, and operates in the same manner as the first switch means 20 in response to the clock signals CK and /CK. This fourth switch means 27 controls the passing of the data from the fourth inverter means 25 to the third inverter means 24 depending on the clock signals CK and /CK. The data output from the fourth inverter means 25 is input to the first switch means 20 via the fourth switch means 27.

According to the master slave type flip-flop circuit shown in FIG. 4, the four switch means are respectively made up of a p-channel or n-channel transistor, instead of being made up of a transmission gate as in the case of the conventional flip-flop circuit. For this reason, the number of gates is reduced compared to the conventional flip-flop circuit, and in addition, and it is only necessary to provide one kind of clock signal.

In addition, when forming the toggle type flip-flop circuit using the flip-flop circuit shown in FIG. 4, the number of inverter means can be reduced by one compared to the conventional flip-flop because the fourth inverter means 15 is used.

On the other hand, according to the master slave type flip-flop circuit shown in FIG. 3, it is possible to omit the third switch means 16 shown in FIG. 4, because the driving capability of the first inverter means 11 is set larger than the driving capability of the second inverter means 12. Further, it is possible to omit the fourth switch means 17 shown in FIG. 4, because the driving capability of the third inverter means 14 is set larger than the driving capability of the fourth inverter means 15. Therefore, the number of gates can further be reduced compared to the flip-flop circuit shown in FIG. 4.

When forming the toggle type flip-flop circuit using the flip-flop circuit shown in FIG. 3, it is possible to omit the third switch means 16 shown in FIG. 4, because the driving capability of the fourth inverter means 15 is set larger than the driving capability of the second inverter means 12.

Figure 5:
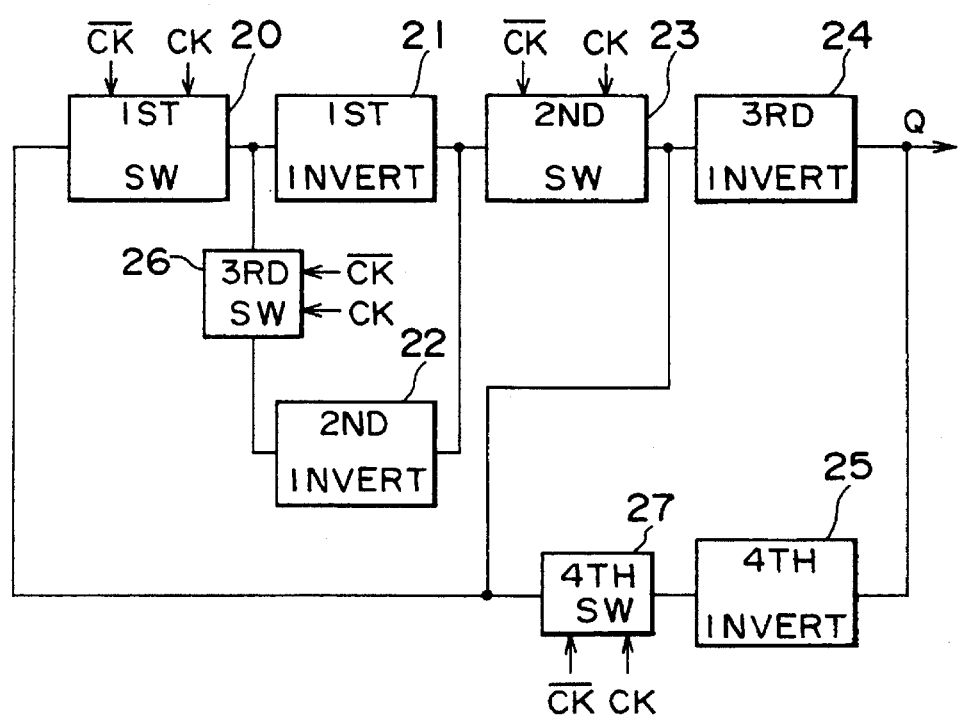
FIG. 5 is a system block diagram for explaining still another aspect of the present invention.

Furthermore, according to the master slave type flip-flop circuit shown in FIG. 5, the fourth switching means are respectively made up of a transmission gate, similarly as in the case of the conventional flip-flop circuit. However, since the toggle type flip-flop circuit can be realized by using the fourth inverter means 25, the number of inverter means can be reduced by one compared to the conventional flip-flop circuit.

Therefore, according to the flip-flop circuit of the present invention described above in conjunction with FIGS. 3 through 5, it is possible to reduce the number of transistor gates required for the master slave type flip-flop circuit or enable driving of the master slave type flip-flop circuit by a single clock signal and also reduce the number of required transistor gates.

Next, a description will be given of a first embodiment of the flip-flop circuit according to the present invention, by referring to FIG. 6. This embodiment employs the operating principle described above in conjunction with FIG. 4.

Figure 6:
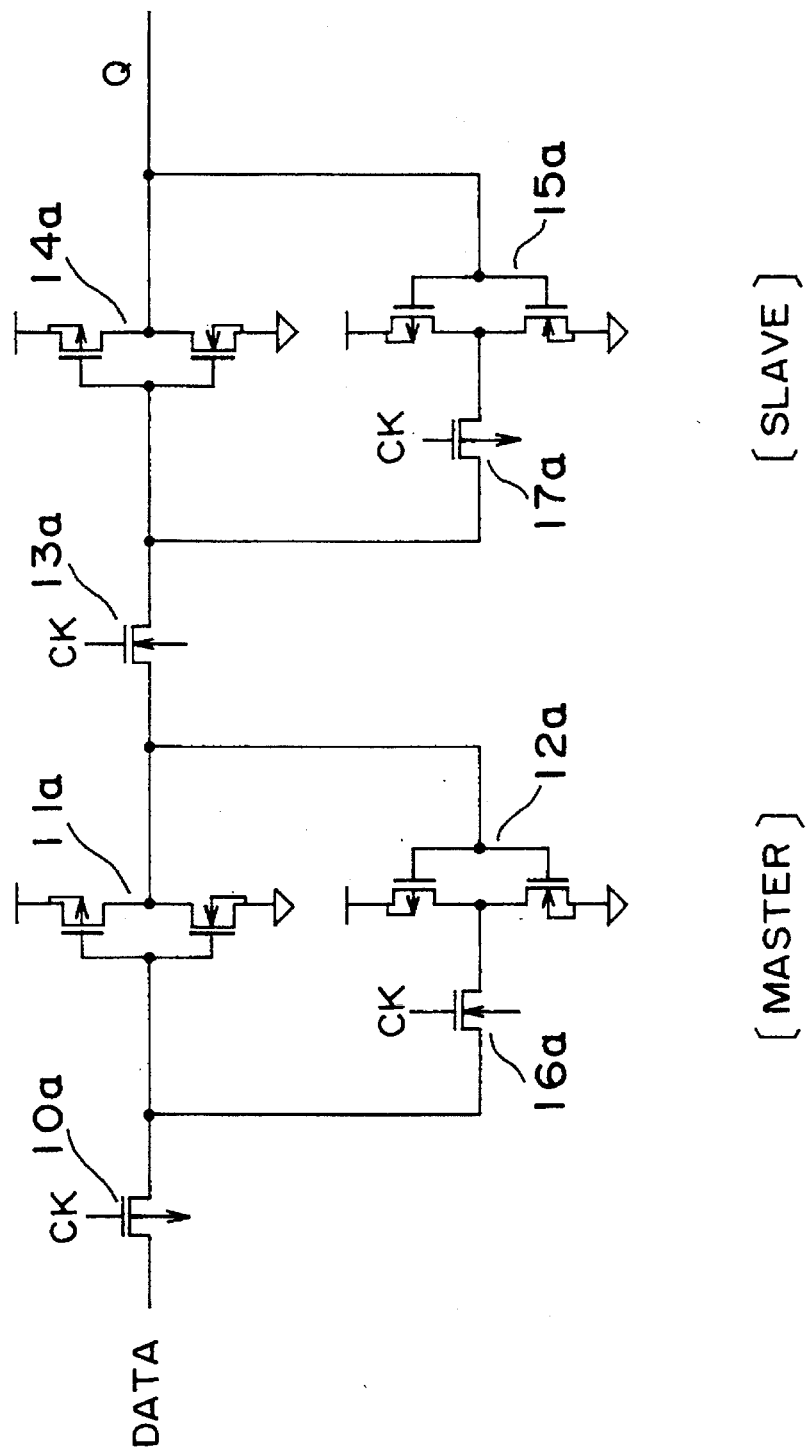
FIG. 6 is a circuit diagram showing a first embodiment of a flip-flop circuit according to the present invention.

The flip-flop circuit shown in FIG. 6 includes a first PMOS gate 10a corresponding to the first switch means 10, a first CMOS inverter 11a corresponding to the first inverter means 11, a second CMOS inverter 12a corresponding to the second inverter means 12, a first NMOS gate 13a corresponding to the second switch means 13, a third CMOS inverter 14a corresponding to the third inverter means 14, a fourth CMOS inverter 15a corresponding to the fourth inverter means 15, a second NMOS gate 16a corresponding to the third switch means 16, and a second PMOS gate 17a corresponding to the fourth switch means 17, which are connected as shown.

When the clock signal CK has a low level, the first PMOS gate 10a turns ON, and the input data is input to the first CMOS inverter 11a. In this state, the first and second NMOS gates 13a and 16a are OFF, and the second PMOS gate 17a is ON.

Next, when the clock signal CK undergoes a transition to a high level, the second NMOS gate 16a turns ON. As a result, the second CMOS inverter 12a inverts the data output from the first CMOS inverter 11a, and inputs the inverted data to the first CMOS inverter 11a, so that the first CMOS inverter 11a latches the input data. On the other hand, the first NMOS gate 13a turns ON, and the input data latched by the first CMOS inverter 11a is input to the third CMOS inverter 14a. In this state, the first and second PMOS gates 10a and 17a are OFF.

Then, when the clock signal CK undergoes a transition to the low level, the second PMOS gate 17a turns ON. Consequently, the fourth CMOS inverter 15a inverts the data output from the third CMOS inverter 14a, and inputs the inverted data to the third CMOS inverter 14a, so that the third CMOS inverter 14a latches and outputs the input data to the outside.

According to this embodiment shown in FIG. 6, it is possible to realize the same operation as the conventional flip-flop circuit by using the first PMOS gate 10a, the first NMOS gate 13a, the second NMOS gate 16a and the second PMOS gate 17a. For this reason, it is possible to realize the flip-flop circuit-using a reduced number of gates compared to the conventional flip-flop circuit, and further, it is possible to realize the flip-flop operation using only a single clock signal CK.

In this embodiment, the PMOS gates are used for the first switch means 10 and the fourth switch means 17, and the NMOS gates are used for the second switch means 13 and the third switch means 16, in order to read the input data during the low-level period of the clock signal CK. However, in order to read the input data during the high-level period of the clock signal CK, the NMOS gates are used for the first switch means 10 and the fourth switch means 17, and the PMOS gates are used for the second switch means 13 and the third switch means 16.

Figure 7:
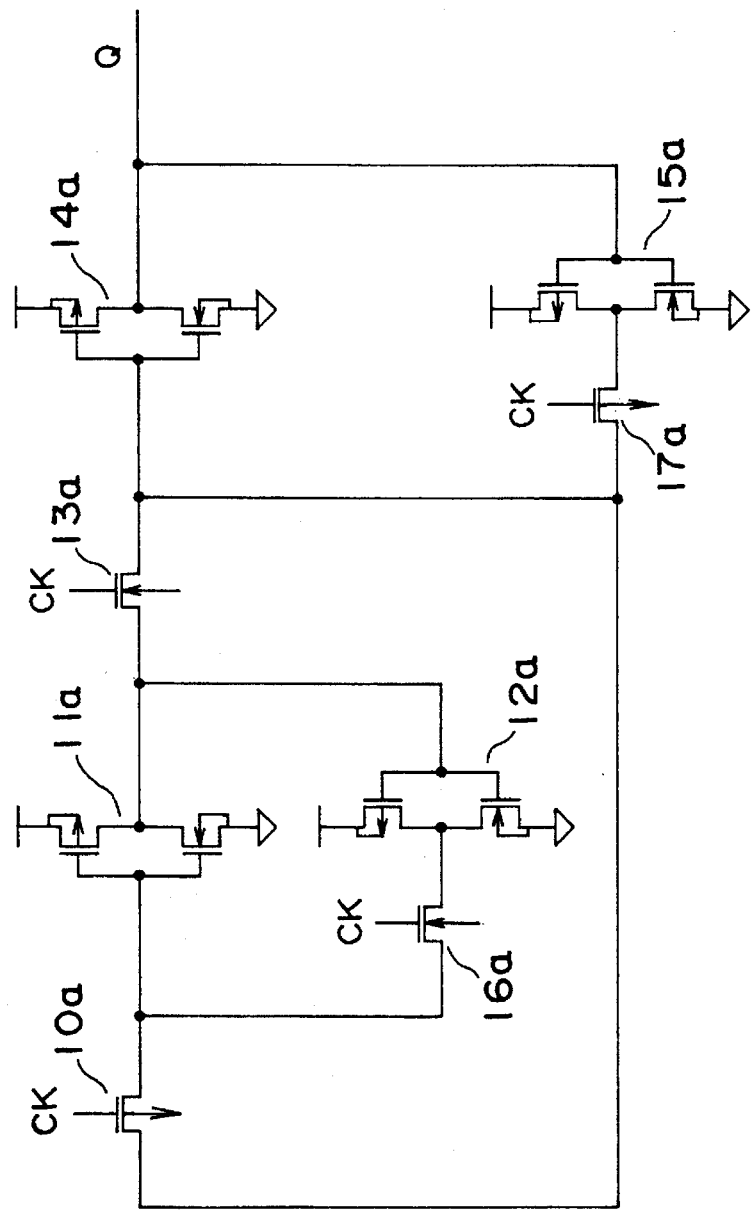
FIG. 7 is a circuit diagram showing a second embodiment of the flip-flop circuit according to the present invention.

Next, a description will be given of a second embodiment of the flip-flop circuit according to the present invention, by referring to FIG. 7. In this embodiment, a toggle type flip-flop circuit is formed using the flip-flop circuit shown in FIG. 6. In FIG. 7, those parts which are the same as those corresponding parts in FIG. 6 are designated by the same reference numerals, and a description thereof will be omitted.

Unlike the conventional case where a CMOS inverter for inverting the output from the terminal Q is additionally provided, this embodiment realizes the toggle type flip-flop circuit by inputting the data output from the fourth CMOS inverter 15a to the first PMOS gate 10a, so as to use the fourth CMOS inverter 15a in common for inverting the data output from the third CMOS inverter 14a and feeding it back to the input of the third CMOS inverter 14a and for inverting the output from the terminal Q and feeding it back to the input of the first PMOS gate 10a.

According to this embodiment, it is possible to realize the toggle type flip-flop circuit using one less CMOS inverter compared to the conventional case.

Figure 8:
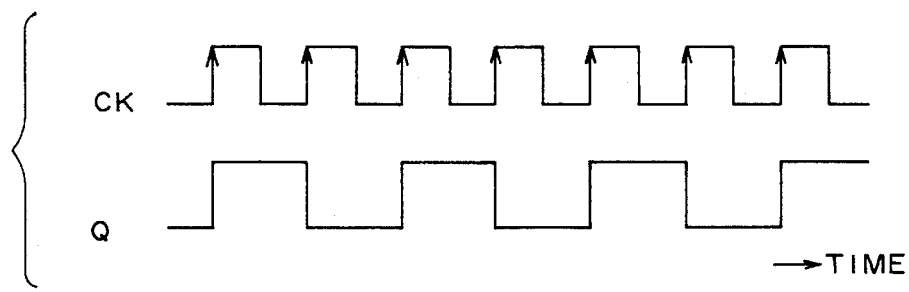
FIG. 8 is a timing chart for explaining the operation of the second embodiment.

FIG. 8 is a timing chart for explaining the output waveform obtained in this embodiment shown in FIG. 7. In FIG. 8, CK denotes the clock signal CK, and Q denotes the output from the terminal Q.

Figure 9:
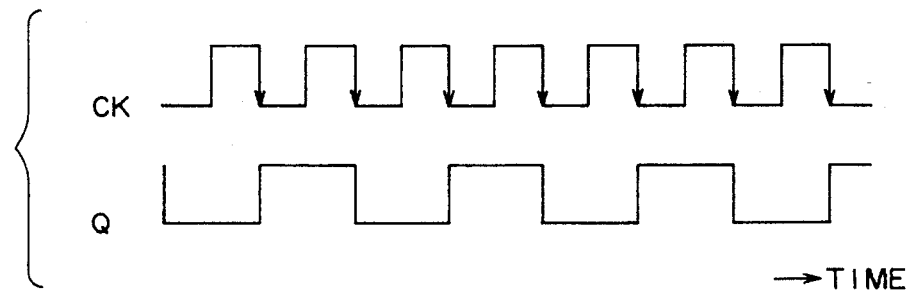
FIG. 9 is a timing chart for explaining the operation of the second embodiment when PMOS gates and NMOS gates are interchanged.

On the other hand, FIG. 9 is a timing chart for explaining the output waveform obtained in this embodiment shown in FIG. 7 when PMOS gates are replaced by NMOS gates and vice versa. In FIG. 9, CK denotes the clock signal CK, and Q denotes the output from the terminal Q.

Figure 10:
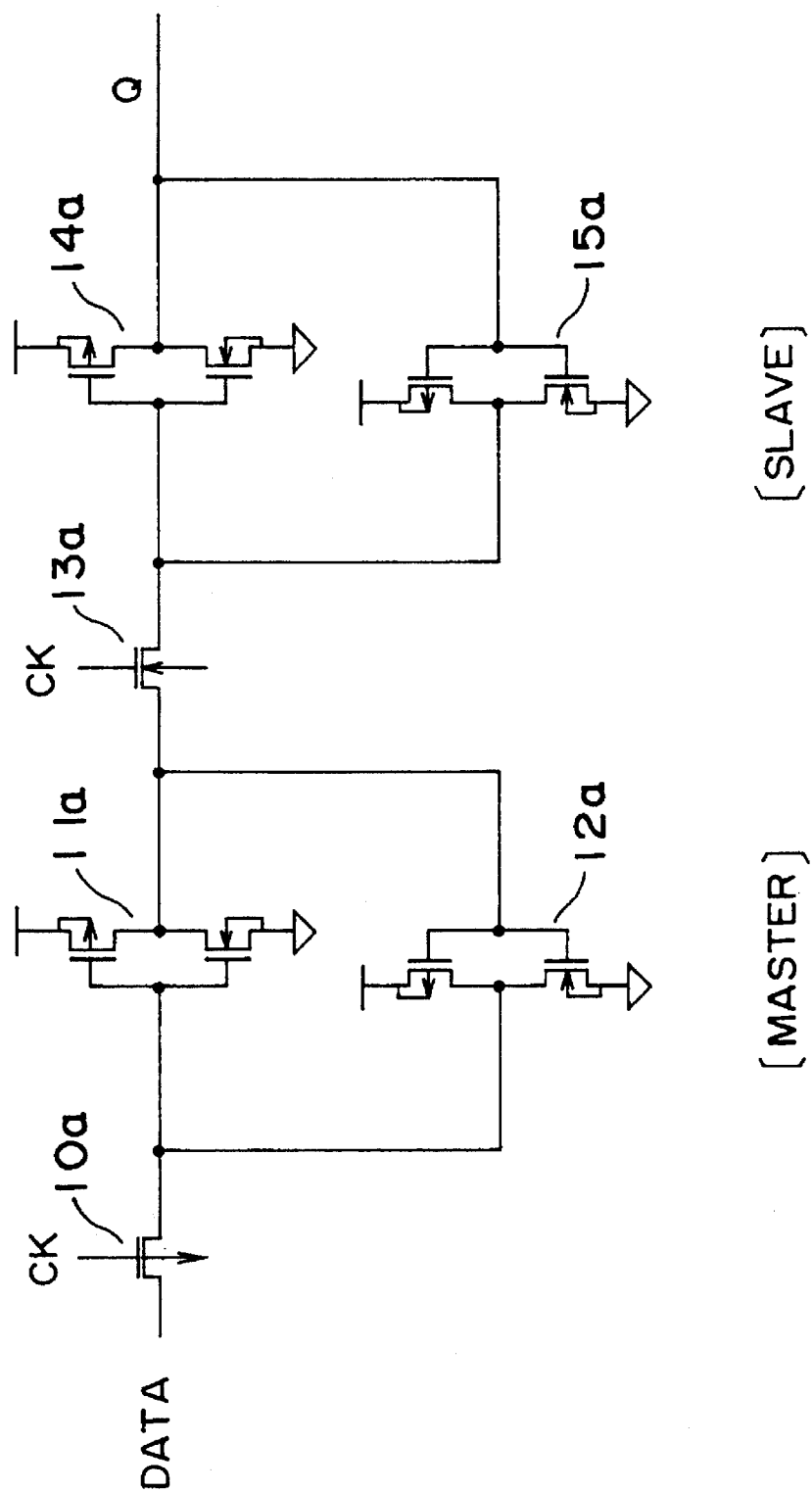
FIG. 10 is a circuit diagram showing a third embodiment of the flip-flop circuit according to the present invention.

Next, a description will be given of a third embodiment of the flip-flop circuit according to the present invention, by referring to FIG. 10. This embodiment employs the operating principle described above in conjunction with FIG. 3. In FIG. 10, those parts which are the same as those corresponding parts in FIG. 6 are designated by the same reference numerals, and a description thereof will be omitted.

In this embodiment, the driving capability of the first CMOS inverter 11a is set larger than the driving capability of the second CMOS inverter 12a. For this reason, the first CMOS inverter 11a can receive the data passed through the first PMOS gate 10a when the first PMOS gate 10a is ON, even if the second NMOS gate 16a shown in FIG. 6 is not provided.

In addition, the driving capability of the third CMOS inverter 14a is set larger than the driving capability of the fourth CMOS inverter 15a. As a result, the third CMOS inverter 14a can receive the data passed through the first NMOS gate 13a when the first NMOS gate 13a is ON, even if the second PMOS gate 17a shown in FIG. 6 is not provided.

Hence, according to this embodiment, it is possible to omit the second NMOS gate 16a and the second PMOS gate 17a which are necessary in the embodiment shown in FIG. 6. Of course, the PMOS gates may be used in place of the NMOS gates and vice versa.

Figure 11:
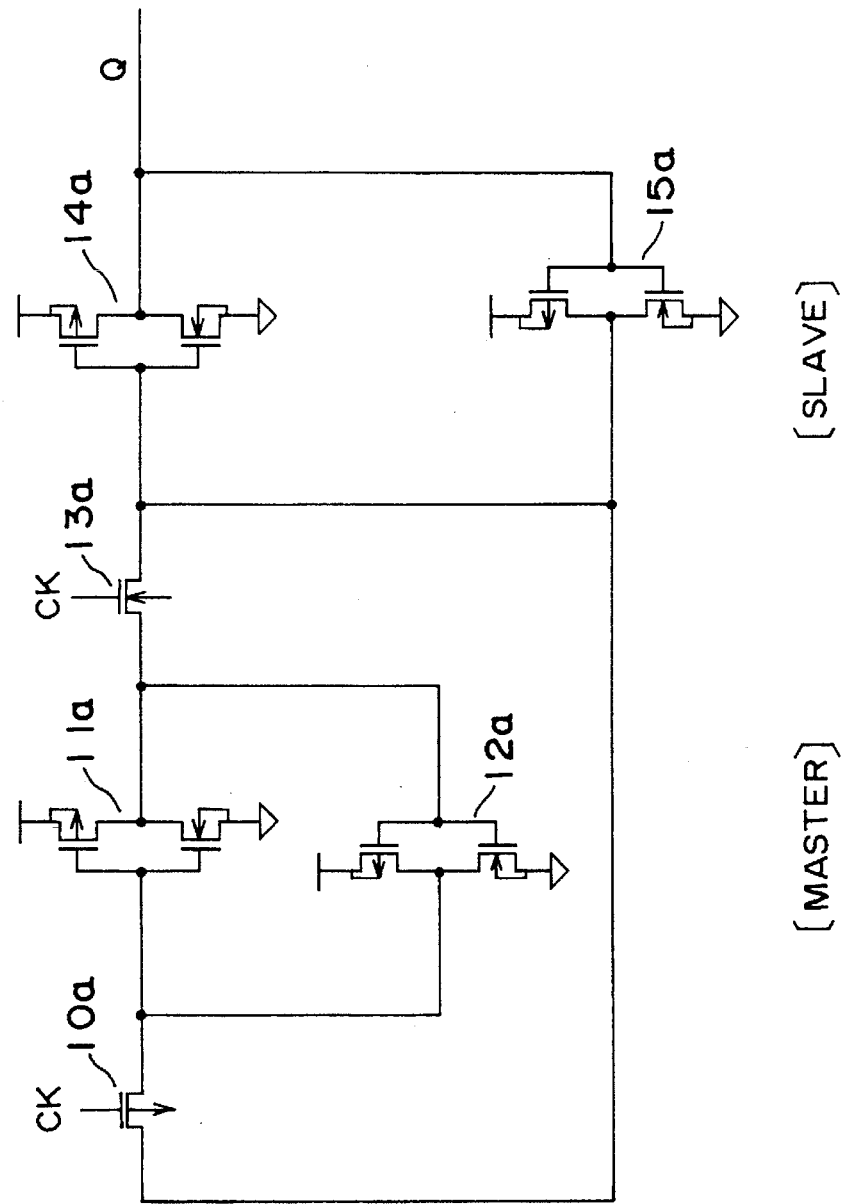
FIG. 11 is a circuit diagram showing a fourth embodiment of the flip-flop circuit according to the present invention.

Next, a description will be given of a fourth embodiment of the flip-flop circuit according to the present invention, by referring to FIG. 11. In this embodiment, a toggle type flip-flop circuit is formed using the flip-flop circuit shown in FIG. 10. In FIG. 11, those parts which are the same as those corresponding parts in FIG. 10 are designated by the same reference numerals, and a description thereof will be omitted.

Unlike the conventional case where a CMOS inverter for inverting the output from the terminal Q is additionally provided, this embodiment realizes the toggle type flip-flop circuit by inputting the data output from the fourth CMOS inverter 15a to the first PMOS gate 10a, so as to use the fourth CMOS inverter 15a in common for inverting the data output from the third CMOS inverter 14a and feeding it back to the input of the third CMOS inverter 14a and for inverting the output from the terminal Q and feeding it back to the input of the first PMOS gate 10a.

According to this embodiment, it is possible to realize the toggle type flip-flop circuit using one less CMOS inverter compared to the conventional case.

Next, a description will be given of a fifth embodiment of the flip-flop circuit according to the present invention, by referring to FIG. 12. In this embodiment, the present invention is applied to the toggle type flip-flop circuit.

Figure 12:
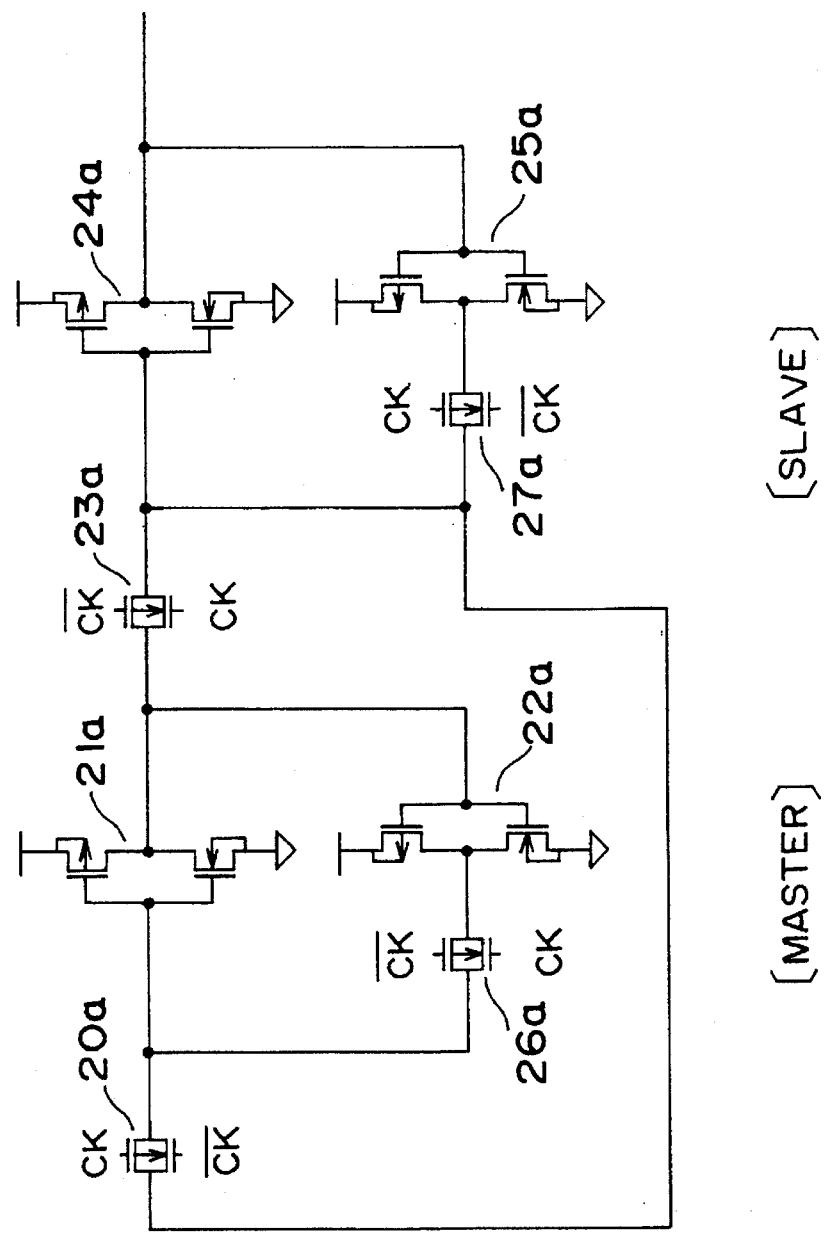
FIG. 12 is a circuit diagram showing a fifth embodiment of the flip-flop circuit according to the present invention.

The flip-flop circuit shown in FIG. 12 includes a first transmission gate 20a corresponding to the first switch means 20, a first CMOS inverter 21a corresponding to the first inverter means 21, a second CMOS inverter 22a corresponding to the second inverter means 22, a second transmission gate 23a corresponding to the second switch means 23, a third CMOS inverter 24a corresponding to the third inverter means 24, a fourth CMOS inverter 25a corresponding to the fourth inverter means 25, a third transmission gate 26a corresponding to the third switch means 26, and a fourth transmission gate 27a corresponding to the fourth switch means 27.

This embodiment of the flip-flop circuit differs from the conventional toggle type flip-flop circuit in that no CMOS inverter is additionally provided to invert the output from the terminal Q. In other words, in this embodiment the data output from the fourth CMOS inverter 25a is input to the first transmission gate 20a, so as to use the fourth CMOS inverter 25a in common for inverting the data output from the third CMOS inverter 24a and feeding it back to the input of the third CMOS inverter 24a and for inverting the output from the terminal Q and feeding it back to the input of the first transmission gate 20a. Hence, it is possible to realize the toggle type flip-flop circuit using one less CMOS inverter compared to the conventional case.

Further, the present invention is not limited to these embodiments, but various variations and modifications may be made without departing from the scope of the present invention.

What is claimed is:

1. A flip-flop circuit comprising:

first switch means, made up of a first conductivity type transistor, for controlling passing of input data in response to a single clock signal;

first inverter means for inverting the data passed through said first switch means;

second inverter means for inverting the data output from said first inverter means into inverted data and for inputting the inverted data to said first inverter means;

second switch means, made up of a second conductivity type transistor, for controlling passing of the data output from said first inverter means in response to said single clock signal, said second conductivity type transistor being one of a P-channel and N-channel transistors, said first conductivity type transistor being the other of the P-channel and N-channel transistors;

third inverter means for inverting the data passed through said second switch means; and fourth inverter means for inverting the data output from said third inverter means into inverted data and for inputting the inverted data to said third inverter means, said first inverter means having a driving capability larger than that of said second inverter means, said third inverter means having a driving capability larger than that of said fourth inverter means, and means for inputting the data output from said fourth inverter means to said first switch means, said fourth inverter means having a driving capability larger than that of said second inverter means.

2. A flip-flop circuit comprising:

first switch means, made up of a first conductivity type transistor, for controlling passing of input data in response to a single clock signal;

first inverter means for inverting the data passed through said first switch means;

second inverter means for inverting the data output from said first inverter means into inverted data and for inputting the inverted data to said first inverter means;

second switch means, made up of a second conductivity type transistor, for controlling passing of the data output from said first inverter means in response to said single clock signal, said second conductivity type transistor being one of a P-channel and N-channel transistors, said first conductivity type transistor being the other of the P-channel and N-channel transistors;

third switching means, made up of a said second conductivity type transistor for controlling passing of the data from said second inverter means to said first inverter means in response to said single clock signal;

third inverter means for inverting the data passed through said second switch means;

fourth inverter means for inverting the data output from said third inverter means into inverted data and for inputting the inverted data to said third inverter means;

fourth switch means, made up of a said first conductivity type transistor, for controlling passing of the data from said fourth inverter means in response to said single clock signal, which further comprises means for inputting the data output from said fourth inverter means to said first switch means via said fourth switch means.

3. A flip-flop circuit comprising:

first switch means, made up of a first transmission gate having transistors, for controlling passing of input data in response to clock signals;

first inverter means for inverting the data passed through said first switch means;

second inverter means for inverting the data output from said first inverter means into inverted data and for inputting the inverted data to said first inverter means;

second switch means, made up of a second transmission gate having transistors, for controlling the passing of the data output from said first inverter means in response to the clock signals, said second transmission gate operating in a complementary manner to said first transmission gate;

third switch means, made up of a said second transmission gate, for controlling passing of the data from said second inverter means to said first inverter means in response to the clock signals;

third inverter means for inverting the data passed through said second switch means;

fourth inverter means for inverting the data output from said third inverter means into inverted data and for inputting the inverted data to said third inverter means;

fourth switch means, made up of a said first transmission gate, for controlling passing of the data from said fourth inverter means to said third inverter means in response to the clock signals; and means for inputting the data output from said fourth inverter means to said first switch means via said fourth switch means.

\* \* \* \* \*